United States Patent [19]

Barbieri et al.

[11] Patent Number: 4,568,407
[45] Date of Patent: Feb. 4, 1986

[54] EQUIPMENT FOR COATING AND FLUSH CUTTING OF A PROTECTIVE PLASTICS FILM OF SILICON SLICES FOR FINAL LAPPING

[75] Inventors: Giuseppe Barbieri, Agrate Brianza; Giancesare Caprotti, Cambiago, both of Italy

[73] Assignee: SGS-ATES Componenti Elettronici S.p.A., Milan, Italy

[21] Appl. No.: 616,111

[22] Filed: May 30, 1984

[30] Foreign Application Priority Data

Jun. 3, 1983 [IT] Italy .................................. 21446 A/83

[51] Int. Cl.⁴ ........................ B32B 31/18; B32B 31/20
[52] U.S. Cl. .................................. 156/510; 156/522; 156/523; 156/577; 156/579
[58] Field of Search ............... 156/510, 515, 523, 577, 156/579, 522

[56] References Cited

U.S. PATENT DOCUMENTS 3,971,691  7/1976  Cairns ................................. 156/577
4,385,956  5/1983  Pearl .................................. 156/577

Primary Examiner—Caleb Weston

[57] ABSTRACT

An equipment for coating and flush cutting of a protective plastics film of silicon slices for final lapping comprises a plate provided with a plurality of seats, each of which intended to exactly contain a slice, a carriage movable along said plate and carrying a roll of said plastics film, and a pressure roller for spreading out said film on said plate and slices accomodated in the respective seats, as well as a trimming device comprising a vertical shaft electric motor and an arm integral with said shaft and carrying a heated circular blade.

11 Claims, 3 Drawing Figures

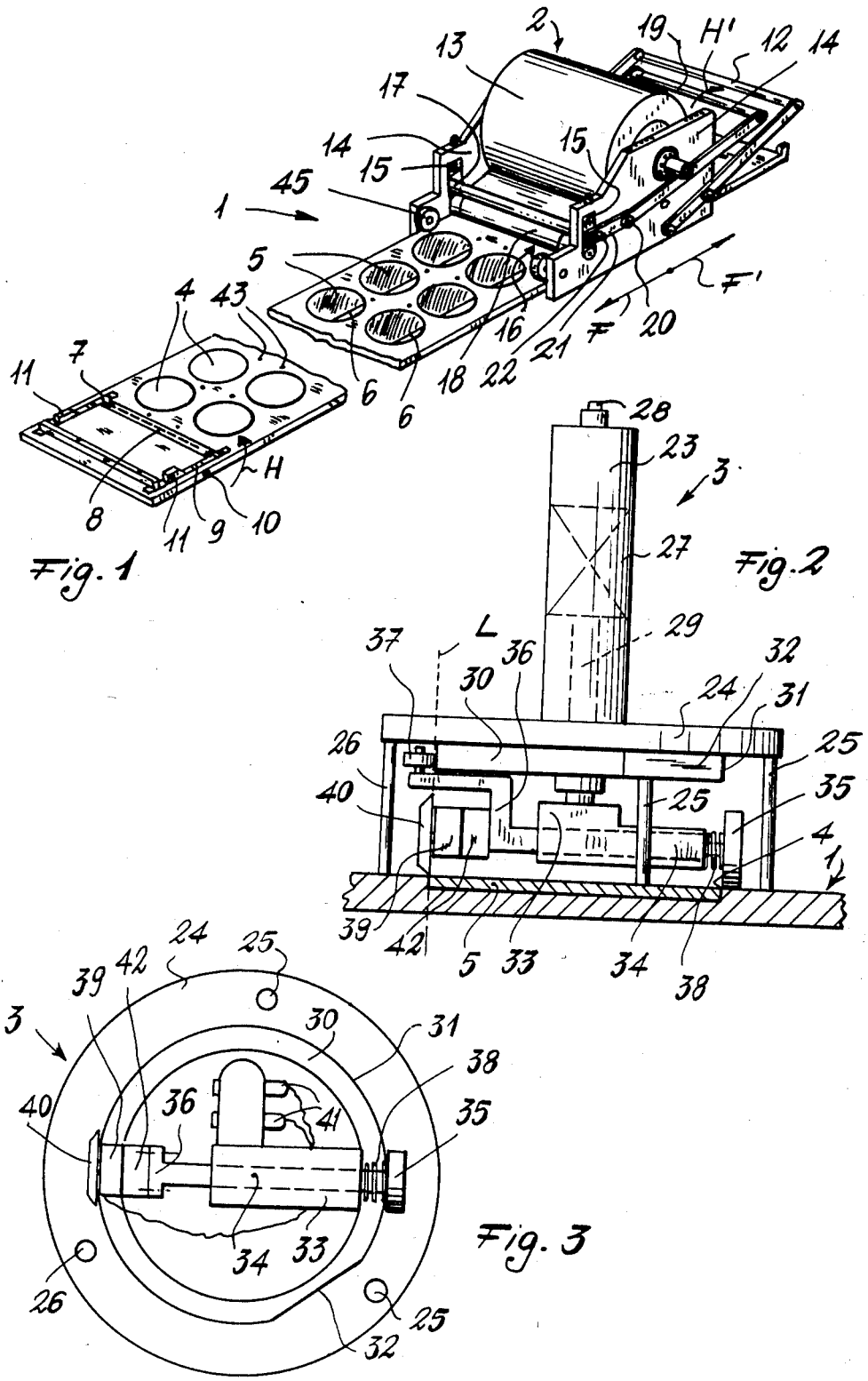

EQUIPMENT FOR COATING AND FLUSH CUTTING OF A PROTECTIVE PLASTICS FILM OF SILICON SLICES FOR FINAL LAPPING

This patent relates to an equipment for coating and flush cutting of a protective plastics film of silicon slices for final lapping.

As well known, in the semiconductor arts use is made of pieces of monocrystalline material of very small dimensions obtained from silicon slices or wafers of semiconductor material having a thickness of about 500 microns and a surface area of some tens of square centimeters. The slices or wafers are then subjected to an operation of final lapping in order to bring the thickness thereof to a predetermined value.

Owing to the slice or wafer brittleness and the necessity of avoiding any contamination of such slices or wafers during final lapping, the slice or wafer face opposite to that to be lapped is coated with a protective plastic film, suitably treated for adherence to the slices or wafers, for example such as that commericially known as "Mylar". Such a film has to be exactly flush cut with respect to the slice or wafer edge to avoid unevenness in final lapping and risks of contamination in said slice or wafer.

At present such an operation of coating of slices or wafers with a plastic film is carried out by spreading the film on the individual slices or wafers and manually trimming the film portions projecting beyond the edge of each slice or wafer.

In industrial production the above mentioned operation of coating and trimming is unduly slow and requires highly skilled operators owing to the delicateness of the operation. Such manual operations can create a bottleneck in the production of semiconductor devices.

It is the object of the present invention to provide an apparatus enabling speedy coating of slices or wafers with a protective film and the perfect flush cutting of said film.

This and further objects of the invention will become evident to those skilled in the art from the reading of the following description and claims.

The apparatus according to the invention is essentially characterized by comprising a plate provided with a plurality of seats, each of which intended to exactly contain a slice or wafer, a carriage movable along said plate and carrying a roll of said plastics film, and a pressure roller for spreading out said film on said plate and slices or wafers accommodated within the respective seats, as well as a trimming device comprising a vertical shaft electric motor and an arm integral with said shaft and carrying a heated circular blade.

THE DRAWINGS

The invention is shown by mere way of unrestrictive example in the figures of the single accompanying drawing, in which:

FIG. 1 is a perspective view of the plate and relative carriage;

FIG. 2 is an enlarged side view of the film trimming device at operative position; and FIG. 3 is a view of the underside of the device shown in FIG. 2.

DETAILED DESCRIPTION OF AN ILLUSTRATIVE EMBODIMENT

Referring to the above figures, the equipment comprises as a whole a plate 1, a carriage 2 and a trimming device 3.

On its upper face said plate 1 provides a plurality of seats 4, each of which for receiving and exactly containing a slice or wafer 5 of constant radius except for a flat portion 6 for correct orientation of slice or wafer 5 in the next machine for masking (process for marking on the slice or wafer surface of intersecting lines to obtain the individual components or "chips"). As clearly shown from FIG. 2, the upper surface of slice or wafer 5 is in each seat 4 exactly flush or slightly projecting with respect to the upper surface of plate 1. A cross notch 7 is provided on one end of said plate 1, along which there is extended a heated wire 8 stretched between two elements 9, pivoted at 10 on the edges of said plate 1 and each having a ridge projecting above said plate 1.

A carriage 2 is associated with said plate 1 and movable in the direction of arrows F—F' by manually pushing on a suitable handgrip 12. A protective film roll 13 is idly mounted on sides 14, the latter having a pair of opposing windows 15 for vertical movement of a set of rollers, generally indicated at 16. Said set comprises an upper transmission roller 17 and a lower rubber coated pressure roller 18 and is driven for upward movement through a handgrip 19, parallel to said handgrip 12, pivoted at 20 on sides 14 and having fork end portions 21, each of which engaging a pin 22 projecting from windows 15 and forming part of said roller set 16. Suitable springs (not shown) constantly urge said set 16 downwardly resulting in constant pressure of roller 18 on plate 1, and more particularly on the upper surface of slices or wafers 5.

The trimming device 3 essentially comprises a handgrip 23 vertically secured on a base 24 provided with two punctiform feet 25 and a third foot 26 parallel to the axis of said handgrip 23. An electric motor 27 is mounted within said handgrip 27 and provided with suitable switch drive means 28, the shaft 29 of which projects beyond a cam 30 integral with the lower surface of base 24 and centered with respect to the latter. This cam 30 has a circular profile 31 including a straight length or section 32 corresponding to the flat portion 6 of slices or wafers 5.

A L-arm 33 is keyed on the end of shaft 29 for support and free slide of a square cross-section element 34, at one end carrying an idle roller 35 and at the opposite end a bell-crank extension 36 carrying a cam follower roller 37 constantly engaging the tracks 31 and 32 of said cam 30 owing to the action of a spring 38 interposed between said roller 35 and arm 33. A metal block 39 is attached on said bell-crank extension 36, in which a heating resistor is inserted and on which a circular blade 40 is rotatably mounted. The resistor is supplied with current by a pair of shoes 41 sliding on tracks (not shown for the sake of clearness) provided on the lower surface of base 24 and is suitable for directly heating said circular blade 40. Between said block 39 and bell-crank extension 36 there is interposed a block of insulating material 42 forming diathermic bridge between said block 39 and arm 33.

Pairs of holes 43 are provided on plate 1 as circumferentially arranged with respect to each seat 4, the function of which will be understood in the following.

In order to spread out said plastics film on the upper surface of plate 1 and accordingly on the slices or wafers 5 accommodated within the respective seats 4, said film is initially caused to pass between rollers 17 and 18 (below roller 17 and above roller 18) and carriage 2, the latter being manually pushed in the direction of arrow F with resulting unrolling of the plastics film and spreading out of the latter through roller 18 on the upper surface of plate 1 and accordingly on said slices or wafers 5. The pressure roller 18 ensures an even spreading of the film without any formation of air pockets between the latter and slices or wafers. On reaching the opposite end, said carriage 2 engages, for example with idle rollers 45 provided on sides 14, the ridges 11, causing elements 9 to oscillate (arrow H) to bring said heated wire 8 in contact with the film and thereby cut the latter. In order to avoid that in return stroke of the carriage (arrow F') the pressure roller 18 may cause a further unrolling of the film in reverse direction, said roller is lifted along with the associated roller 17 through operation on handgrip 19 (arrow H').

For film trimming about the edge of slice or wafer 5, an operator will position the two feet 25 within the holes 43 with resulting correct positioning of the circular blade 40 at the edge of slice or wafer 5, and this owing to exact matching between the profile of cam 30 and edge of seat 4 and exact matching between said profile of said cam and circular blade 40, as shown by dotted line L in FIG. 2. The operation of switch 28 will provide current to motor 27 and arm 33 will effect at least one revolution with resulting cut, both for mechanical action and thermal action, of the film through operation of the heated circular blade 40. The idle roller 35 will act as a pressing roller for the film portion externally of seat 4 and at the same time as a resisting element to the circular blade 40. Of course, the length of feet 25 and depth of holes 43, as well as length of foot 26 (not necessarily intended to cooperate with holes 43) will be suitably calculated depending on the diameter of the circular blade 40 and idle roller 35, to allow for the required pressure of said blade on the plastics film during trimming. If desired, said shaft 29 of motor 27 may be provided with a coupling for elastic yielding to further facilitate the pressure action of said circular blade 40 on the plastics film during operation of said trimming device 3.

What is claimed is:

1. An apparatus for laminating and flush cutting of a protective plastic film on silicon slices or wafers, said apparatus comprising a plate provided with a plurality of seats, each of which is sized to receive a slice or wafer, a carriage movable along said plate and carrying a roll of said plastic film, and a pressure roller for spreading out said film on said plate and slices or wafers accommodated in the respective seats, and a trimming device comprising a shaft, an electric motor for driving the shaft and an arm coupled with said shaft and carrying a heated circular blade.

2. An apparatus as claimed in claim 1, wherein said arm of the trimming device has associated therewith a cam having the same profile as that of said seats, and wherein that said trimming device comprise means for correct positioning thereof with respect to each seat, said heated circular blade confronting the edge of said seats.

3. An apparatus as claimed in claim 2, wherein said means for correct positioning of the trimming device with respect to the seats comprise holes in said plate circumferentially arranged about each seat, and feet disposed on said trimming device arranged to cooperate with said holes.

4. An apparatus as claimed in claim 3, further comprising a roller disposed on the arm of the trimming device opposite the heated circular blade, said roller acting as a resisting and pressing member for the film portion adjacent the periphery of the seats.

5. An apparatus as claimed in claim 4, wherein said heated circular blade and resisting roller are mounted on said arm through the interposition of means controlled by said cam.

6. An apparatus as claimed in claim 2, wherein said arm is elongated and wherein said heated circular blade is axially movably mounted on said arm, the axial position of said blade on said arm being controlled by said cam.

7. An apparatus as claimed in claim 2, further comprising a roller mounted on the arm of the trimming device opposite the heated circular blade, said roller acting as a resisting and pressing member for the film portion adjacent the periphery of the seats.

8. An apparatus as claimed in claim 7, characterized in that said heated circular blade and roller are mounted on said arm through the interposition of means controlled by said cam.

9. An apparatus as claimed in claim 2, wherein said means for correct positioning of the trimming device with respect to the seats comprise holes in said plate circumferentially arranged about each seat, and feet disposed on said trimming device arranged to cooperate with said holes.

10. An apparatus as claimed in claim 9, further comprising a roller mounted on the arm of the trimming device opposite the heated circular blade, said roller acting as a resisting and pressing member for the film portion adjacent the periphery of the seats.

11. An apparatus as claimed in claim 10, wherein said heated circular blade and roller are mounted on said arm through the interposition of means controlled by said cam.

* * * * *